US010160645B2

(12) United States Patent
Maksymovych et al.

(10) Patent No.: US 10,160,645 B2
(45) Date of Patent: Dec. 25, 2018

(54) MICROWAVE AC CONDUCTIVITY OF DOMAIN WALLS

(71) Applicant: UT-Battelle, LLC, Oak Ridge, TN (US)

(72) Inventors: Petro Maksymovych, Oak Ridge, TN (US); Alexander Tselev, Oak Ridge, TN (US); Sergei V. Kalinin, Oak Ridge, TN (US)

(73) Assignees: UT-BATTELLE, LLC, Oak Ridge, TN (US); UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 122 days.

(21) Appl. No.: 15/285,332

(22) Filed: Oct. 4, 2016

(65) Prior Publication Data

US 2017/0099055 A1 Apr. 6, 2017

Related U.S. Application Data

(60) Provisional application No. 62/237,663, filed on Oct. 6, 2015.

(51) Int. Cl.
*B82Y 25/00* (2011.01)
*H03L 5/00* (2006.01)
(Continued)

(52) U.S. Cl.
CPC ............... *B82Y 25/00* (2013.01); *G11B 9/02* (2013.01); *G11C 11/2275* (2013.01); *H03L 5/00* (2013.01)

(58) Field of Classification Search
CPC ............... H03L 5/00; H01P 3/16; H03H 7/38
(Continued)

(56) References Cited

U.S. PATENT DOCUMENTS 5,155,658 A 10/1992 Inam et al.
5,886,867 A 3/1999 Chivukula et al.
(Continued)

FOREIGN PATENT DOCUMENTS

KR 1020020002606 A 1/2002
WO WO 2005004198 A3 1/2005

OTHER PUBLICATIONS

Maksymovych et al., "Dynamic Conductivity of Ferroelectric Domain Walls in BiFeO3", Nano Letters, vol. 11, 2011, pp. 1906-1912.*
(Continued)

*Primary Examiner* — Benny Lee
*Assistant Examiner* — Hafizur Rahman
(74) *Attorney, Agent, or Firm* — Brinks Gilson & Lione

(57) ABSTRACT

Microwave AC conductivity may be improved or tuned in a material, for example, a dielectric or semiconductor material, by manipulating domain wall morphology in the material. Domain walls may be created, erased or reconfigured to control the AC conductivity, for example, for crafting circuit elements. The density and placement of domain walls may increase or decrease the AC conductivity and may control AC conduction pathways through the material. An electric potential applied to the material's surface may create a desired pattern of domain walls to meet desired AC conductivity criteria. Incline angle of the domain walls may be modified relative to a crystallographic axis of the material to temporarily or permanently modify or gate AC conductivity of the material. For example, the AC conductivity of the material may be gated by domain wall incline angle to increase, decrease or throttle current flowing through the material for an electronic circuit element.

24 Claims, 9 Drawing Sheets
(9 of 9 Drawing Sheet(s) Filed in Color)

(51) Int. Cl.
*G11B 9/02* (2006.01)
*G11C 11/22* (2006.01)

(58) Field of Classification Search
USPC .......................................................... 333/17.1
See application file for complete search history.

(56) References Cited

U.S. PATENT DOCUMENTS

| | | | |
|---|---|---|---|
| 7,449,738 | B2 | 11/2008 | Eom et al. |
| 7,759,237 | B2 | 7/2010 | Ahn et al. |
| 8,980,648 | B1 | 3/2015 | Hao et al. |
| 2011/0308580 | A1 | 12/2011 | Seidel et al. |

OTHER PUBLICATIONS

Abdul Ahad, Dielectric constant at -band microwave frequencies for multiferroic BiFeO3 thin films, Journal of Applied Physics, vol. 105, 07D912, 2009, pp. 1-3.*

Sobiestianskas et al.,"Microwave dielectric properties of BiFeO3 thin film prepared by aqueous chemical solution deposition method", Processing and Application of Ceramics, vol. 3, No. 4, 2009, pp. 1-4.*

Jesse, S., et al., "Switching Spectroscopy Piezoresponse Force Microscopy of Ferroelectric Materials," *Applied Physics. Letters*, vol. 88, 062908, (2006).

Lunkenheimer, P. et al., "Apparent Giant Dielectric Constants, Dielectric Relaxation, and Ac-Conductivity of Hexagonal Perovskites $La_{1.2}Sr_{2.7}BO_{7.73}$ (B=Ru, Ir)," *Journal of Solid State Chemistry*, vol. 179, pp. 3965-3973, (2006).

Maksymovych, P, et al., "Dynamic Conductivity of Ferroelectric Domain Walls in $BiFeO_3$," *American Chemical Society, Nano Letters*, vol. 11, pp. 1906-1912, (2011).

Maksymovych, P. et al., "Tunable Metallic Conductance in Ferroelectric Nanodomains," *American Chemical Society, Nano Letters*, vol. 12, pp. 209-213, (2012).

McNeal, Mark P., et al., "The Effect of Grain and Particle Size on the Microwave Properties of Barium Titanate ($BaTiO_3$)," *Journal of Applied Physics*, (2p), (1998).

Pollak, M., et al., "Low-Frequency Conductivity Due to Hopping Processes in Silicon", *Physical Review*, vol. 122, No. 6, pp. 1742-1753, (1961).

Van Staveren, M.P.J., et al., "Metal-Cluster Compounds and Universal Features of the Hopping Conductivity of Solids," *Physics Letters*, vol. 208, No. 1, pp. 1-96, (1991).

* cited by examiner

MICROWAVE AC CONDUCTIVITY OF DOMAIN WALLS

CROSS REFERENCES TO RELATED APPLICATIONS

This patent application makes reference to and claims priority to U.S. Provisional Patent Application Ser. No. 62/237,663, filed on Oct. 6, 2015, which is hereby incorporated by reference in its entirety.

STATEMENT REGARDING FEDERALLY FUNDED RESEARCH AND DEVELOPMENT

The United States Government has rights in this invention pursuant to contract no. DE-AC05-000R22725 between the United States Department of Energy and UT-Battelle, LLC.

BACKGROUND OF THE INVENTION

1. Technical Field

This disclosure relates generally to microwave-frequency (microwave) alternating current (AC) conductivity in dielectric or semiconducting materials. Specifically, the disclosure pertains to configuring and tuning microwave AC conductivity in ferroelectric materials for electronic and microwave device elements.

2. Related Art

In ferroelectric materials, domains of uniform polarizations may be separated by domain walls. Domain walls may have a lateral width of only a few nm. The concept of domain wall electronics and utilization of domain walls and other topological defects within ferroelectric materials has been pursued in view of electronic device applications. Despite the electrically insulating nature of ferroelectric materials, several types of ferroelectric domain walls have exhibited direct current (DC) conduction. However, understanding of domain wall conduction mechanisms and progress towards practical utilization of domain wall circuits have so far been impeded by the low conduction observed in domain wall materials and the large ferroelectric-electrode contact resistance.

Efforts to measure domain wall current flow have relied on relatively large DC voltage biases resulting in highly rectifying current-voltage characteristics with detectable current at only one bias polarity. The issue of contact resistance has been particularly important. A contact interface Schottky barrier conceals the intrinsic mechanisms of charge transport along in-depth regions of domain walls. Although the contact resistance can be overcome with a sufficiently large applied bias, such an electric field applied in the contact junctions generally becomes comparable to or exceeds coercive fields for domain wall motion and even polarization reversal (switching). Therefore, resistive readout at DC is generally destructive as it readily causes the loss of domain wall stability and is capable of displacing and erasing the domain walls. These effects have severely limited the prospects of domain wall circuits, particularly in materials with desired low coercive fields.

BRIEF SUMMARY OF THE INVENTION

A method, article of manufacture and system are provided for improved microwave AC conductivity and for tuning microwave AC conductivity in a dielectric or semiconducting material, for example, in a ferroelectric material. Microwave AC conduction paths may be configured within the dielectric or semiconducting material by manipulating domain wall morphology that controls the microwave AC conductivity. The microwave AC conductivity may be increased or decreased. Current pathways may be formed by creating new domain walls, erasing domain walls or reconfiguring domain walls. In some embodiments, the density and placement of domain walls within the dielectric or semiconducting material may be modified to control the microwave AC conductivity and conduction pathways of the material. An electric potential may be applied at one or more positions on a surface of the material to create a desired pattern of domain walls and/or to meet desired criteria for microwave AC conductivity. Furthermore, an incline angle of the domain walls may be modified, relative to a crystallographic axis of the material, by applying an electric field across a volume of the material. The incline angle of the domain walls may be temporarily modified by the application of the electric field, and the microwave AC conductivity may be temporarily modified or gated by the temporary change in incline angle of the domain walls. Alternatively, the incline angle of the domain wall may be modified and held in a stable state by the application of the electric field and introducing defects into the material, and thus, the microwave AC conductivity of the material may be reconfigured and held in a stable state or be made permanent.

A cantilever tip may be utilized to apply an electric potential to a dielectric or semiconducting region of a material to modify the domain wall morphology and manipulate the conductivity of the material. For example, domain walls may be created in the material or removed from the material by applying the electric potential in a specified pattern. In some embodiments, the material may be a thin film comprising ferroelectric domains and a cantilever tip may be utilized to apply the electric potential to a region of the material to manipulate the AC conductivity. Furthermore, in some embodiments, the material may be annealed to modify domain walls and the annealed material may be further modified by creating domain walls in the material or removing domain walls to control the microwave AC conductivity of the material. A microwave AC signal transmitted through the material after manipulating the domain wall morphology may overcome contact resistance and local conduction barriers in the material.

Other methods, articles of manufacture, systems, features and advantages will be, or will become apparent to one with skill in the art upon examination of the following figures and detailed description. It is intended that all such additional methods, articles of manufacture, systems, features and advantages be included within this description, be within the scope of the invention, and be protected by the following claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The system may be better understood with reference to the following drawings and description. Non-limiting and non-exhaustive descriptions are described with reference to the following drawings. The components shown in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
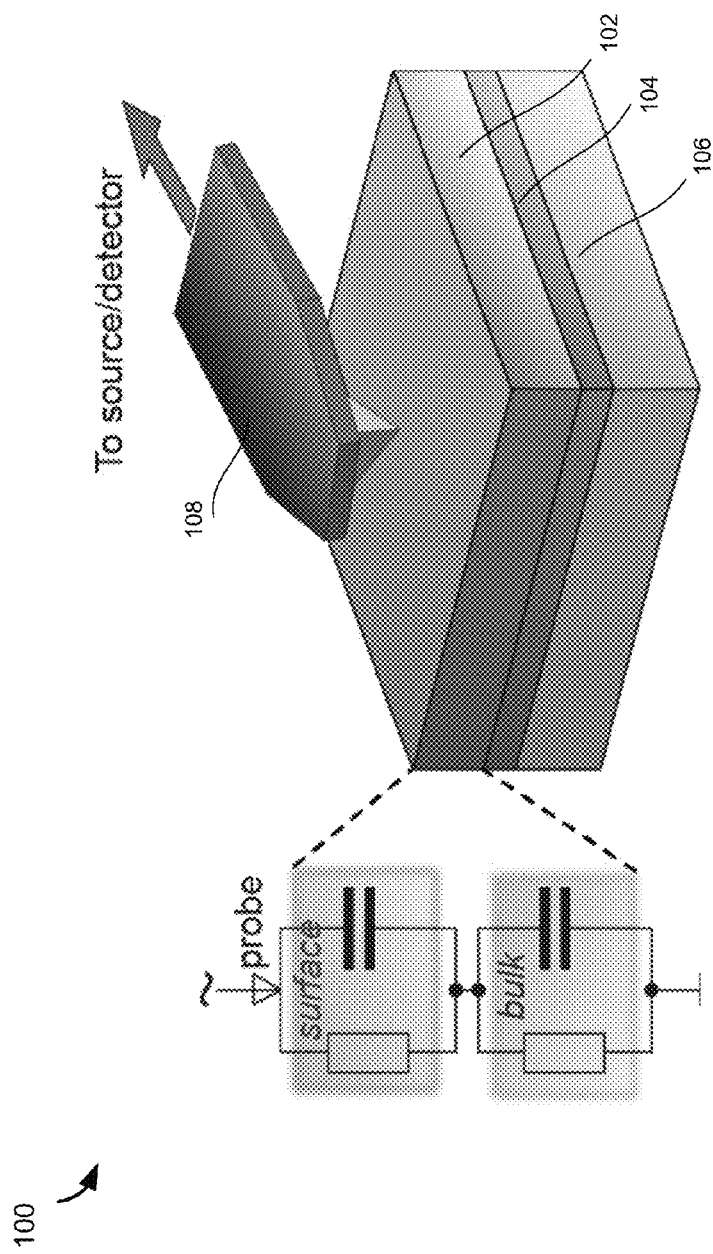
FIG. 1 is a schematic diagram of an exemplary apparatus for configuring, tuning and measuring microwave AC conductivity in a dielectric or semiconducting sample.

A domain wall may be formed as a transitional entity between domains within or through various types of structures in materials and various sample sizes, for example, in thin films of nanometer-scale size, up through centimeter-scale size and larger. The width of a domain wall may be on the order nanometers. Domain walls may be formed in a sample at the time when the sample is fabricated or may be added, removed or reconfigured by various processes in an existing sample. These manipulations of domain walls may be performed without changing the chemical properties of the host material or the domains in the sample, which may be referred to as the domain bulk. Proliferation and movement of domain walls within a material may also depend on chemical composition of the material and sample shape. Ferroelectric materials are one example of materials that may exhibit domain walls separating domains of uniform polarization. However, this disclosure is not limited to ferroelectric materials, and any suitable material possessing domain wall features may be utilized.

Ferroelectric materials comprising domains and domain walls are of great interest as elementary building blocks for future electronic devices, especially at nanoscale size and having field-controllable topology. To realize electronic functions, domain walls should be good electrical conductors that can be accessed non-destructively. However, this may be difficult to achieve owing to intrinsically large electronic band gaps in a material, and consequently, large contact resistance. Moreover, direct electrical current (DC) flowing through a ferroelectric material may cause fatigue, damage or break down of the material. Alternating electrical current (AC) of a microwave frequency is free from this deficiency. Therefore, AC circuits incorporating domain walls have beneficial potential to all electronic circuit elements over their DC counterparts.

Generally, under a "microwave frequency", a single frequency or a set of discrete frequencies, or a continuum of frequencies, or any combination of a single frequency, a set of discrete frequencies, and a continuum of frequencies in a frequency range from 0.01 GHz to 500 GHz is understood. However, this disclosure is not limited to the frequency range indicated here insofar the proper functionality of the domains and domains walls is fundamentally based on the flow of an alternating electrical current of a sufficiently high frequency as opposed to direct current.

It may be shown that at high-frequencies, AC conduction is an efficient way to access and harness domain wall electrical conductance, even in materials with nominally poor DC conductance. High-frequency electrical charge current may be insensitive to contact barriers at an electrode-ferroelectric interface, thereby enabling quantitative and non-destructive manipulation and read-out of domain wall conductance. For example, nominally uncharged domain walls in conventional ferroelectric thin films of lead zirconate and bismuth ferrite may be strongly AC conducting, on par with domain walls carrying an electrical charge. The AC conductivity may be at least 100 times higher than DC conductivity with the same magnitude of probing voltage. An estimated domain wall microwave AC conductance in this example amounts to that comparable to doped silicon.

In some instances, domain walls may develop electric charge at the surface of the domain wall while the domain bulk may have little or no electric charge. The domain walls may become AC conductive at microwave frequencies because charges on the surface of the domain walls may be introduced into the domain bulk near the domain walls and may temporarily reconfigure doping of the domain bulk material, which enables the increase in microwave AC conductivity through the material The density of free charge carriers that produce microwave AC conductance may be controlled by controlling properties of the domain walls. Therefore, the microwave AC conductance may be tunable through doping as well as type and density of defects in the material that incorporates the domain walls, controlling the shape and density of the domain walls, and controlling electric or strain fields applied to the material incorporating the domain walls.

Furthermore, the domain wall may assume a rough, as opposed to straight, morphology assisted, for example, by a disorder in a sample. Such a configuration may hinder DC conduction, but may remain manyfold more conducting at gigahertz frequencies than the surrounding domains.

Depending on the incline angle of a domain wall relative to a crystallographic axis of a material, AC current through the domain walls, or AC conductivity, may be increased or decreased. As the angle of a domain wall increases with respect to the axis of the crystalline structure of the sample, the domain wall becomes electrically charged. Once charge carriers accumulate to compensate the increasing static charge of the domain wall, the AC conductivity increases. In general, conductivity will be exponentially dependent on the incline angle, changing by about a factor of 1000 with increasing incline angle from 0° to 90°. The angle of a domain wall may be controlled by the strength of the applied electric field.

It is understood that domain walls may also become AC-conducting by the phenomenon of flexoelectricity, where the electric charge of the domain wall is produced by its atomic-scale structure regardless of the global tilting angle of the domain wall. Flexoelectric coupling is expected to increase electrical AC conductance by a factor of about 10.

The AC conductance in ferroelectric domain walls provides an important loss mechanism for microwave devices based on ferroelectric materials and other dielectrics. Exemplary applications of microwave conducting domain walls may include microwave switches, ferroelectric racetrack-type memory, and neuromorphic memory element.

Microwave switches are elements of microwave circuits, which in a general sense allow microwave-frequency electromagnetic waves or AC currents to fully or partially pass through a wave or current path, or to block the passage. Tunable microwave AC conduction of domain walls as well as tunable domain wall density in the material may provide tunable impedance seen by the waves or currents to enable the device functionality.

In one embodiment, racetrack-type memory may utilize domain walls to store information. The information may be recorded and retrieved based on domain wall positions and/or motion along a one-dimensional structure (for example, a wire-like object). Various means, such as electric and/or magnetic fields or mechanical actions, may be used to create new domain walls and to move existing domain walls. In the embodiment assumed here, microwave AC conductivity of domain walls may be used for domain wall detection and information readout. This is in contrast to existing racetrack memory architectures utilizing ferromagnetic materials. This feature may be generalized for use in two-dimensional material structures such as thin films.

Neuromorphic memory elements provide multiple stable (remnant) levels of microwave-frequency AC conductance in response to pulses of an electric field applied to a ferroelectric domain wall in a material. Depending on the shape, duration or polarity of the pulses, the stable levels of the domain wall AC conductance can be increased or decreased as desired.

FIG. 1 is a schematic diagram of an exemplary apparatus for configuring, tuning and measuring microwave AC conductivity in a dielectric or semiconducting sample. Referring to FIG. 1, there is shown a system 100 comprising a material sample 102, a bottom electrode 104 and a substrate 106. Also shown is a probe electrode 108.

In one example, the material sample 102 may be a thin film of a conventional ferroelectric $Pb(Zr_{0.2}Ti_{0.8})O_3$ (PZT), the bottom electrode 104 may be a 50 nm-thick $SrRuO_3$ (SRO) bottom electrode that may be deposited on the substrate 106 that may be an SrTiO3(001) (STO) substrate. Although the material sample 102 is shown as a thin film in connection with the electrode 104 and substrate 106, the disclosure is not limited in this regard. For example, the disclosure is not limited to any specific type of material, or to any size or shape of the material sample, and any suitable material of any suitable dimensions, which may host one or more domain walls, may be utilized. Furthermore, in some embodiments, the material sample 102 may not be attached to an electrode or a substrate or both. The material sample 102 may be referred to as a sample, a material or a film, for example. The sample 102 may comprise domains or domain bulk made up of the sample material and domain walls within the domain bulk. The sample 102 may be a ferroelectric material that may have one or more domain walls.

The probe electrode 108 together with the electrode 104 may be operable to apply a DC or AC voltage or signal across the sample 102. Furthermore, the electrode 108 may be operable to detect local properties and signals of the sample 102, for example, conductance, height or mechanical deformation of the sample 102. In some embodiments, the electrode 108 may comprise an atomic force microscopy (AFM) type cantilever and tip (as shown in FIG. 1).

Although the electrode 108 is shown as an AFM-type probe, the disclosure is not limited in this regard, and any suitable electrode or probe may be utilized. However, the electrode 108 may be referred to as a cantilever tip or cantilever probe.

The probe 108 may be utilized for a variety of purposes and processes. In some embodiments, the probe may be utilized to configure or tune microwave AC conductivity in the sample 102, by creating, removing or reconfiguring one or more domain walls within the sample 102. In other words, AC conductivity may be designed or controlled in the sample 102 by manipulating the morphology and/or density of the domain walls in the sample 102. Furthermore, the AC conductivity of the sample 102 may be designed and implemented or tuned to meet specified conductivity criteria for a device or a circuit element, for example.

A DC electric field may be applied to ferroelectric material to create domain walls. In one embodiment, the probe 108 may be used to apply a DC voltage at a point on the sample 102 or may be used to apply a DC voltage at a number of points on the sample 102. This application of a DC voltage may cause a domain wall to propagate through the sample material from the point where the DC voltage is applied. For example, a domain wall may be created in the form of a cylinder traversing the sample 102. However, other domain geometries may be formed by applying DC voltage to the sample 102. In one example, moving the probe 108 across the surface of the sample 102 in a line and applying the DC voltage along the line, or to a series of points along the line, may form a domain wall through the sample 102 in the form of a sheet or plane geometry. This process may be repeated to form multiple sheets across the sample 102. For example, see FIG. 2 images (b) and (c) that show a top view of parallel domain walls that extend though the thickness of the film, which were created using a cantilever tip and raster scanned applications of DC voltage over the surface of a dielectric thin film. Furthermore, any suitable geometry of domain walls including straight or curved lines or filled-in areas or blocks may be formed using this technique of applying a DC voltage to the surface of the sample 102. Also, using electrodes of a different size or different shape, or changing the value of the applied voltage may affect the morphology of the domain walls. Domain walls may also be erased by further applying a voltage at a particular location on the surface of the sample 102, which causes polarization domains to collapse, erasing the domain wall. By changing the morphology of the domain walls in the sample 102, the conductivity of the sample may be modified as desired.

Other methods may also be utilized for configuring or tuning microwave AC conductivity in the sample 102. For example, prior to manipulating the domain wall morphology or domain wall density by applying DC voltage to the sample 102, the sample 102 may be annealed, which may form spontaneous domain walls. Also domain walls may be formed during growth of the sample 102 crystal. In one embodiment, when a ferroelectric crystal is grown, it may have an intrinsic pattern of domain walls that may be reconfigured by applying the DC voltage.

In some cases, the ferroelectric crystal may be thermally cycled to change the pattern of domain walls. As the density of domain walls increases for a given region of a material, the microwave AC conductivity may increase proportionally.

Figure 2:
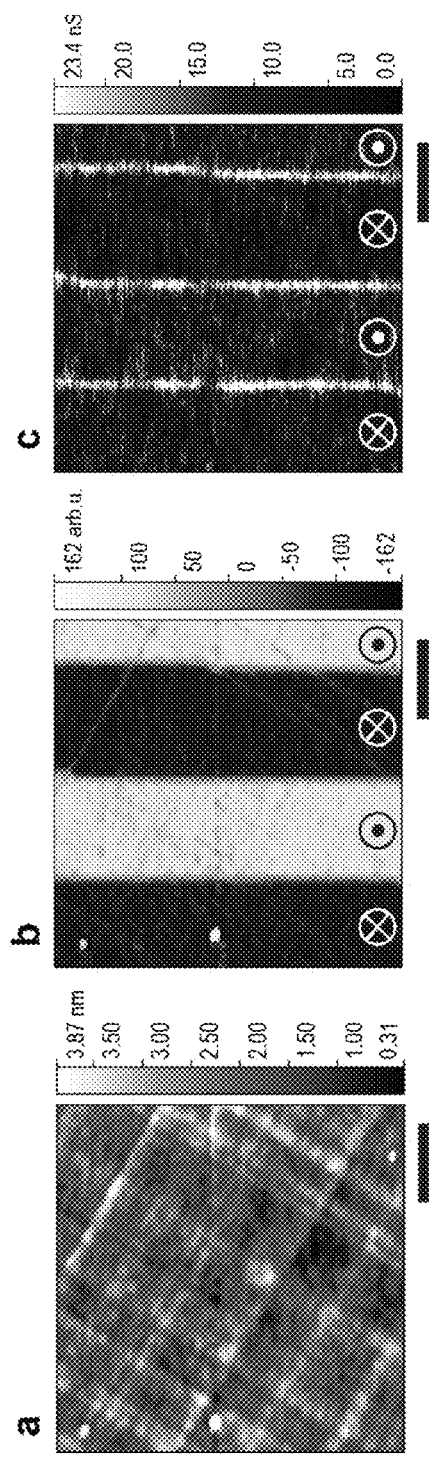
FIG. 2 includes a set of images that reveal structural topography, polarization domains (regions of uniform electric polarization of the material), and microwave AC conductance that is strongly enhanced at the boundaries of polarization domains (at domain walls) in an as-grown material (a $Pb(Zr_{0.2}Ti_{0.8})O_3$ film).
Figure 3:
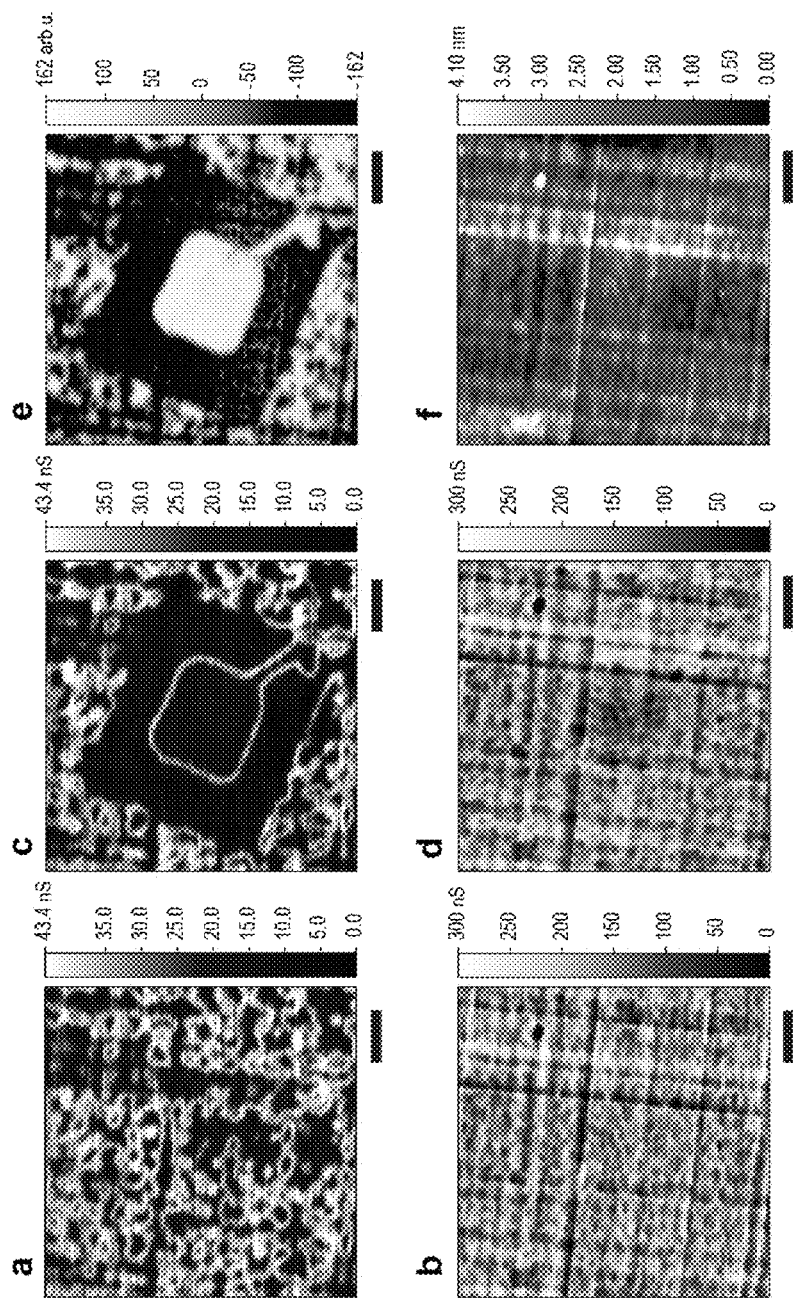
FIG. 3 is a set of images showing microwave AC conductance of the domain walls in annealed material (a $Pb(Zr_{0.2}Ti_{0.8})O_3$ film), manipulation of net microwave conductance by selective removal of some of the domain walls, capacitance signals, and structural topography over the same area.

DC voltages may be applied in a specified pattern to the annealed or the originally grown material to create or remove domain wall AC conduction pathways as desired (see FIG. 2 image (c) and FIG. 3 images (a) and (c)). In one embodiment, the morphology of domain walls within the sample 102 may be reconfigured or tuned by applying an electric field across a volume of sample 102. This is shown in FIG. 3, images (a) and (c).

This electric field may cause the domain walls to tilt or incline with respect to the axis of the crystalline structure of the sample 102, and as a result, may reconfigure or tune the conductivity of the sample 102. In some instances, this effect may be temporary and may be utilized to alter or gate the microwave AC conductivity of the sample 102. For example, by exerting the electric field and causing a larger incline angle of the domain walls relative to the crystallographic axis of the material, microwave AC current through the domain walls, or AC conductivity, may be increased. In general, conductivity will be exponentially dependent on incline angle, changing by about a factor of 1000 with increasing incline angle from 0° to 90°. A stronger electric field will yield a greater angle of incline of the domain wall and in turn, greater conductivity.

In some embodiments, the density of defects in the materials will control the microwave conductivity of each individual domain wall, sometimes in a non-linear proportionality to the defect density.

Finite tilt angle that increases AC conductivity can be stabilized or made permanent by introducing defects or doping the material. In this case, the domain wall becomes morphologically rough along the thickness of the sample. The roughness is caused by local pinning of the domain wall by defect with local tilting it away from its equilibrium straight configuration. A higher tilt angle causes the domain wall to become more conducting. On average positive and negative tilt angles will exist along the wall. This configuration may not be DC-conducting but will be conducting at AC.

Various microwave AC electrical devices or circuit elements may be formed using these techniques for designing and implementing AC conductivity in a dielectric or semiconducting material. Therefore, sample material 102 may be prepared such that the AC conductivity may meet specified criteria for a device or circuit element In some embodiments, the electrode 108 may be a scanning microwave impedance microscopy (sMIM) type probe that may be utilized for imaging conduction in domain walls of the sample 102. The probe 108 may terminate a microwave transmission line. A reflectometer-based detection system (not shown) may be utilized to monitor changes of high-frequency impedance in the probe 108 and the sample 102, as a system, to follow alterations of local permittivity and conductivity of the sample 102 material under the probe 108. The probe 108 and the sample 102 may be referred to as a tip-sample system.

Conductivity in a sample material may be measured utilizing the system 100. In one exemplary embodiment, microwaves at a frequency f≈3 GHz may be delivered to a sensing tip of the probe 108 and to the sample 102, through a stripline fabricated on a cantilever probe 108. A reflectometer may measure signal characteristics, for example, amplitude and phase of a wave reflected from the tip, and may represent the results as a change in admittance $Y=G+i 2\pi f C$ of the tip-sample system through two channels sMIM-G and sMIM-C, corresponding to conductance G and capacitance C, respectively. Due to the capacitance of an interface space charge layer or conduction-blocking layers on the sample 102, electrical behavior of the sample surface may be described by a parallel resistor-capacitor circuit as shown in FIG. 1 in a lumped elements diagram. An intrinsic dielectric response and conduction of the material bulk 102 are represented by another parallel resistor-capacitor circuit in the lumped elements diagram in FIG. 1.

Further details regarding exemplary sMIM measurements are described with respect to FIGS. 2-9. AC conductivity was imaged and measured using sMIM operating at a frequency f≈3 GHz. However, the disclosure is not limited with respect to any specific device for detecting or imaging conduction in domain walls of the sample 102 and any suitable device for measuring the electrical behavior or spatial changes of the sample 102 may be utilized.

With respect to pristine films, measurements were carried out on a 100 nm thick epitaxial thin film 102 of $Pb(Zr_{0.2}Ti_{0.8})O_3$ (100) (PZT) grown using pulsed laser deposition on a single-crystal $TiO_2$-terminated $SrTiO_3$ (001) substrate 106 with 50 nm $SrRuO_3$ as a bottom electrode 104 as shown in FIG. 1. The PZT film 102 has a tetragonal lattice with the polarization axis along the surface normal. The as-grown ferroelectric polarization points to the film surface. Ferroelectric domains were created and manipulated using cantilever probes.

FIG. 2 includes a set of images of surface topography, piezoresponse (mechanical deformation in response to applied electric field), and AC conductance of the PZT film 102. FIG. 2, image (a) is an image of the surface topography of the film 102. FIG. 2, image (b) is an image of local piezoelectric response of the film showing a stripe domain structure with polarization P orientated up ⊙ and down ⊗ in the ferroelectric domains of the film 102 as indicated in the image. The image (b) was acquired with use of the piezoresponse force microscopy (PFM) technique. FIG. 2, image (c) is an AC conductance image (revealed in the sMIM-G channel), which clearly indicates conductivity in the walls of the stripe domains that are shown in FIG. 2, image (b). The stripe domain structure seen in images of FIG. 2 was formed by sequentially applying DC bias voltage $V_{bias}=-7$ V and +7 V to the scanning probe 108 in respect to the bottom electrode 104. FIG. 2 images were taken with a zero DC bias at the probe 108 and an AC voltage amplitude ≲300 mV. All images in FIG. 2 were obtained from the same area of the pristine PZT film. Scale bars in FIG. 2, images (a)-(c) are 1 μm.

With respect to effects of annealing, FIG. 3 is a set of images of AC conductivity and manipulation of conducting domain walls in an annealed PZT film. The PZT film shown in FIG. 3 image (a) was annealed under reducing conditions (in vacuum, $10^{-8}$ Torr at 350° C. for 20 min.). FIG. 3 image (a) is a sMIM-G image where conducting walls of spontaneous domains of a few-hundred-nm size are clearly seen. Polarization directions in the adjacent spontaneous domains are opposite to each other. FIG. 3 image (b) shows an sMIM-C image recorded simultaneously with the image (a). FIG. 3 image (c) is an sMIM-G image of the box-in-box domain structure created by applying a DC voltage with the probe after the image in (a) was taken. Spontaneous domains and domain walls were erased inside the structure and the newly created domain walls of the structure were conducting. FIG. 3 image (d) is an sMIM-C image recorded simultaneously with image (c). FIG. 3 image (e) is a combined out-of-plane PFM image acquired right after image (c). FIG. 3 image (f) is an image of the film surface topography recorded simultaneously with image (e). Comparing FIG. 3 images (b) and (d) with image (f), it is seen that the sMIM-C signal is dominated by a cross-talk with the surface topography. No traces of domain walls are seen in FIG. 3 image (d). Scale bars in FIG. 3 images (a-f) are 1 μm.

Domain walls in FIG. 2 image (c) and FIG. 3 images (a) and (c) are clearly conducting unlike the bulk of the surrounding domains, while no contrast between the two is seen in the simultaneous permittivity images (see FIG. 3 images (b) and (d) obtained through the sMIM-C channel). Domain structures of more complicated geometries were created, which also revealed microwave conductance of the domain walls. Erasing domain walls by reconfiguring ferroelectric domains leaves no observable traces in the sMIM-G images (FIG. 3 image c).

With regard to the effects of annealing, an increased AC conductance in the PZT film subject to heat-treatment indicates that the AC conduction of domain walls is associated with mobile charge carriers. Specifically, the PZT film was annealed under reducing conditions (in vacuum, $10^{-8}$ Torr at 350° C. for 20 min.). This process depletes a small amount of oxygen and creates oxygen vacancies. The vacancies act as electron donors increasing the number of charge carriers in the film. The sMIM-G response of the domain walls in the annealed film was about 1.5-2 times larger than the value of the pristine film.

Figure 4:
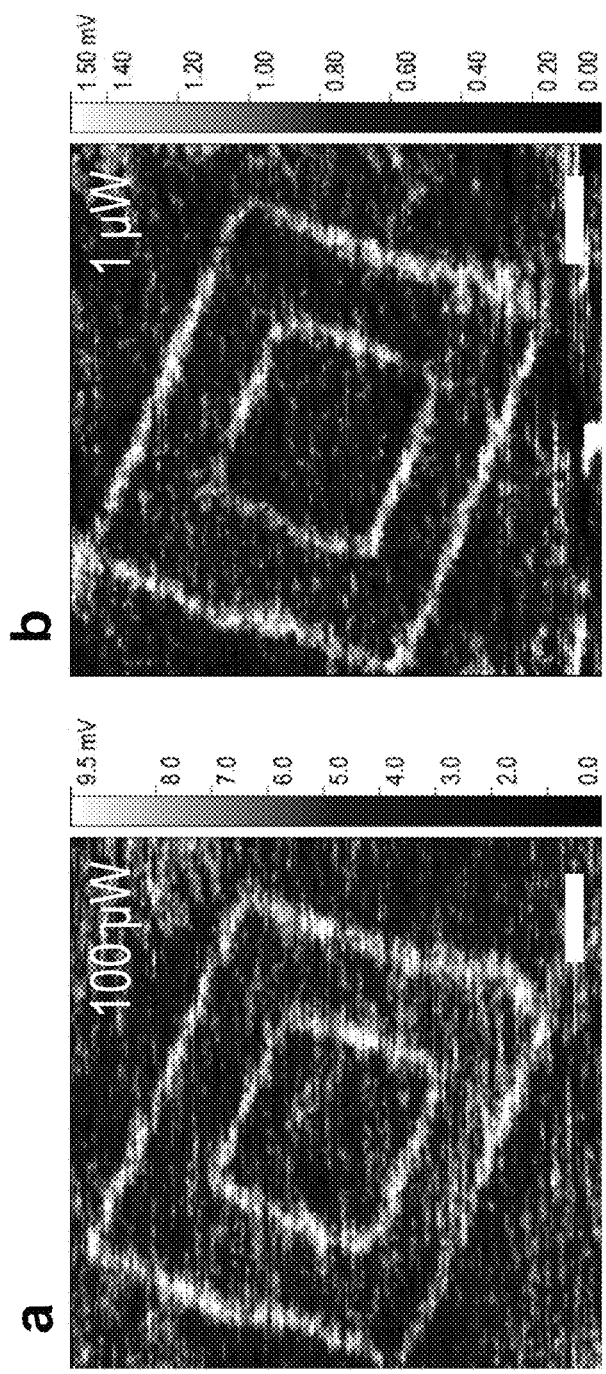
FIG. 4 is a set of images representing independence of the domain wall response from the microwave power level.

FIG. 4 is a set of images representing independence of the domain wall response from the microwave power level. The microwave power level during acquisition of FIG. 4 image (a) was set to 100 μW (−10 dBm). FIG. 4 image (b) represents an sMIM-G image of the same area acquired immediately after images in FIG. 4 (a) at the microwave power level 1 μW (−30 dBm), which corresponds to a 10-fold reduction of the AC voltage amplitude at the probe in comparison with image (a) of FIG. 3. Based on the source power, it can be estimated that the voltage amplitude at the probe tip does not exceed ca. 300 mVac with a 100 μW power and ca. 30 mVac at 1 μW. A tenfold reduction of the AC voltage amplitude did not change the domain wall contrast in the image (b). The images represent an uncalibrated signal, which is approximately proportional to the microwave AC voltage amplitude. As shown, the response of the domain walls with respect to the domain bulk is roughly 6 times larger in terms of the output voltage with 100 μW than with 1 μW, as can be concluded from the ranges of the color scales near the images. Scale bars in the images are 1 μm.

Figure 5:
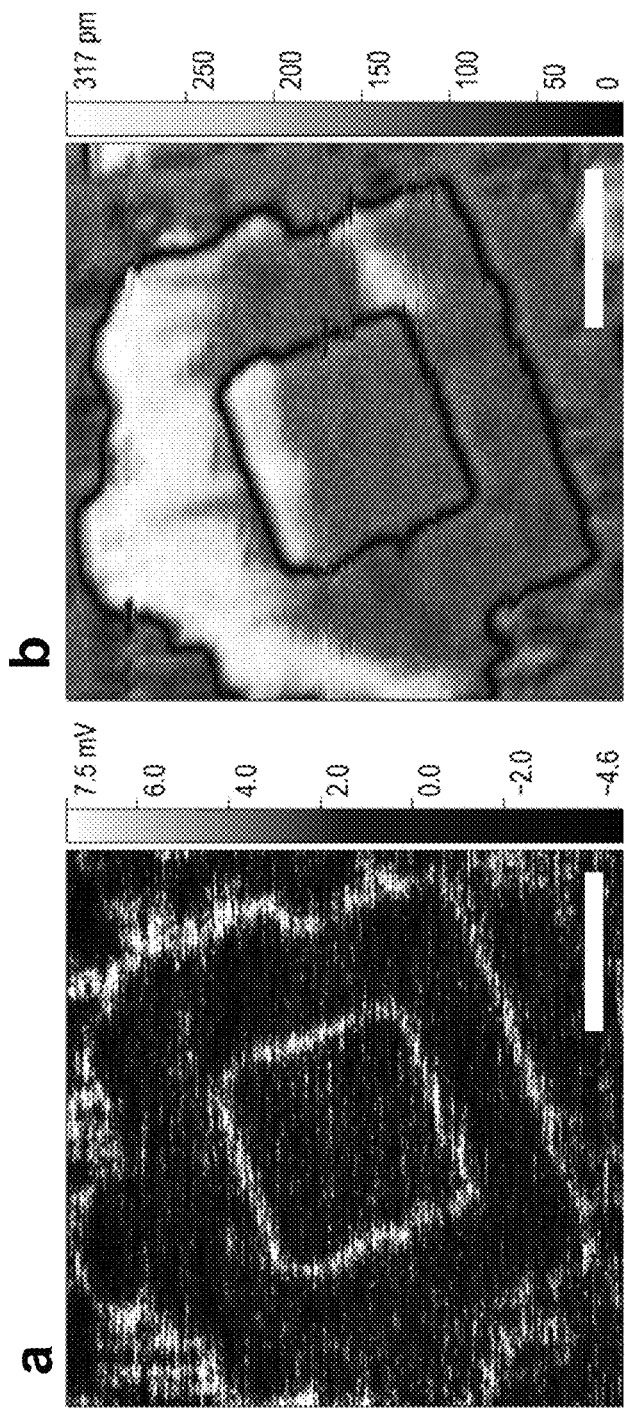
FIG. 5 is images of microwave AC conduction and piezoresponse amplitude of a $BiFeO_3$ film.

FIG. 5 is a set of exemplary images of piezoresponse and sMIM images of a $BiFeO_3$ film used in place of the PZT sample 102 used in FIG. 1. FIG. 5 image (a) shows the image of AC conductance of ferroelectric domain walls. FIG. 5 image (b) is the corresponding image of piezoresponse that shows ferroelectric domain walls as black lines. The box-in-box domain structure seen in images (a) and (b) of FIG. 5 was formed by applying $V_{bias}$=−6 V and +6 V to the scanning probe 108 in respect to the bottom electrode 104. In FIG. 5 images (a) and (b), the scale bars are 2 μm.

Whereas the AC conduction associated with mobile charge carriers explains the observed microwave response of the ferroelectric domain walls, domain wall vibrations near equilibrium positions forced by the high-frequency electric field of the probe should be considered as an alternative origin of the sMIM-G response described above. Such vibrations would result in microwave energy dissipation, which can be indistinguishable from the mobile-charge high-frequency conduction in the sMIM measurements. However, it should be taken into account that displacement of domain walls in response to the applied electric field contributes to material polarizability and permittivity. When a domain wall is present under the sMIM probe, it is expected that the extrinsic contribution of the domain wall vibration to the intrinsic material permittivity is significant and, therefore, can be detected in the capacitance channel if the associated energy loss is detectable by the conduction channel. In tested embodiments, however, while changes of the film permittivity could be readily observed by tuning the permittivity with an applied bias, no contrast from conducting domain walls could be seen in the corresponding sMIM-C images (FIGS. 3b and 3d). This is further strengthened by single-point sMIM measurements combined with simultaneous switching spectroscopy PFM.

Figure 6:
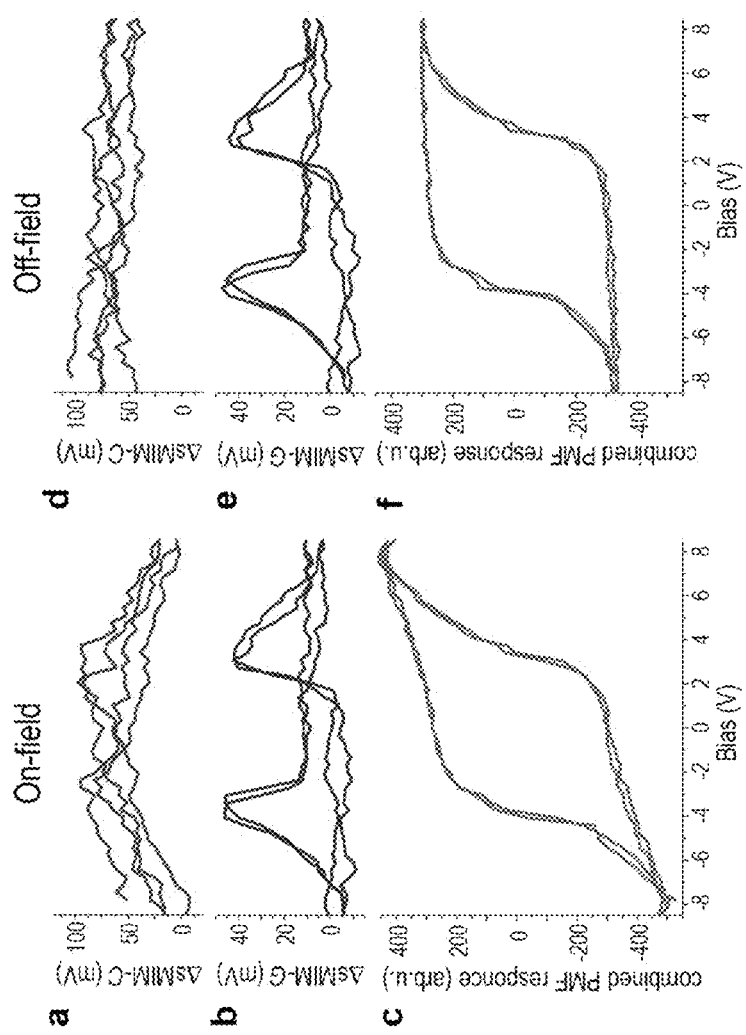
FIG. 6 is a set of curves representing single-point dielectric tunability, microwave AC conductance and piezoresponse as functions of probe DC bias voltage in switching spectroscopy piezoresponse measurements.

FIG. 6 is a set of curves representing exemplary data of single-point (no probe motion) sMIM measurements simultaneous with switching spectroscopy PFM measurements. In the switching spectroscopy PFM, voltage bias is applied to the probe in a series of pulses of varying amplitude, and PFM as well as sMIM responses are measured during application of a pulse and in between consecutive pulses (when the probe bias is set to zero). The responses during pulse application (on-field) and in between corresponding pulses (off-field, or remnant) are plotted separately as functions of the pulse amplitude.

FIG. 6, image (a) represents on-field sMIM-C signal and image (b) represents on-field sMIM-G signal corresponding to on-field out-of-plane PFM hysteresis loop displayed in image (c) for a $BiFeO_3$ film as an example. FIG. 6, image (d) represents off-field sMIM-C and image (e) represents off-field sMIM-G signals corresponding to remnant out-of-plane PFM hysteresis loop of the film shown in image (f). While the on-field sMIM-C signal (see FIG. 6 image (a)) shows the trend expected for the dielectric tunability, the remnant sMIM-C response (see FIG. 6 image (d)) is constant over probe bias, being the same at the polarization switching when domain walls are present under the probe and away from it when the probe is surrounded by a uniformly polarized material. At the same time, the on- and off-field sMIM-G signals (see FIG. 6 images (b) and (e)) are nearly identical, with conduction peaks around switching events. A very similar behavior was observed with PZT and $BiFeO_3$ films evidencing that the effect is weakly dependent on the specific nature of the material and, hence, surrounding and dynamic characteristics of the domain walls. It can be concluded that the domain wall vibrations, if present, do not contribute enough to be detectable and to explain the observed AC conduction of domain walls.

Figure 7:
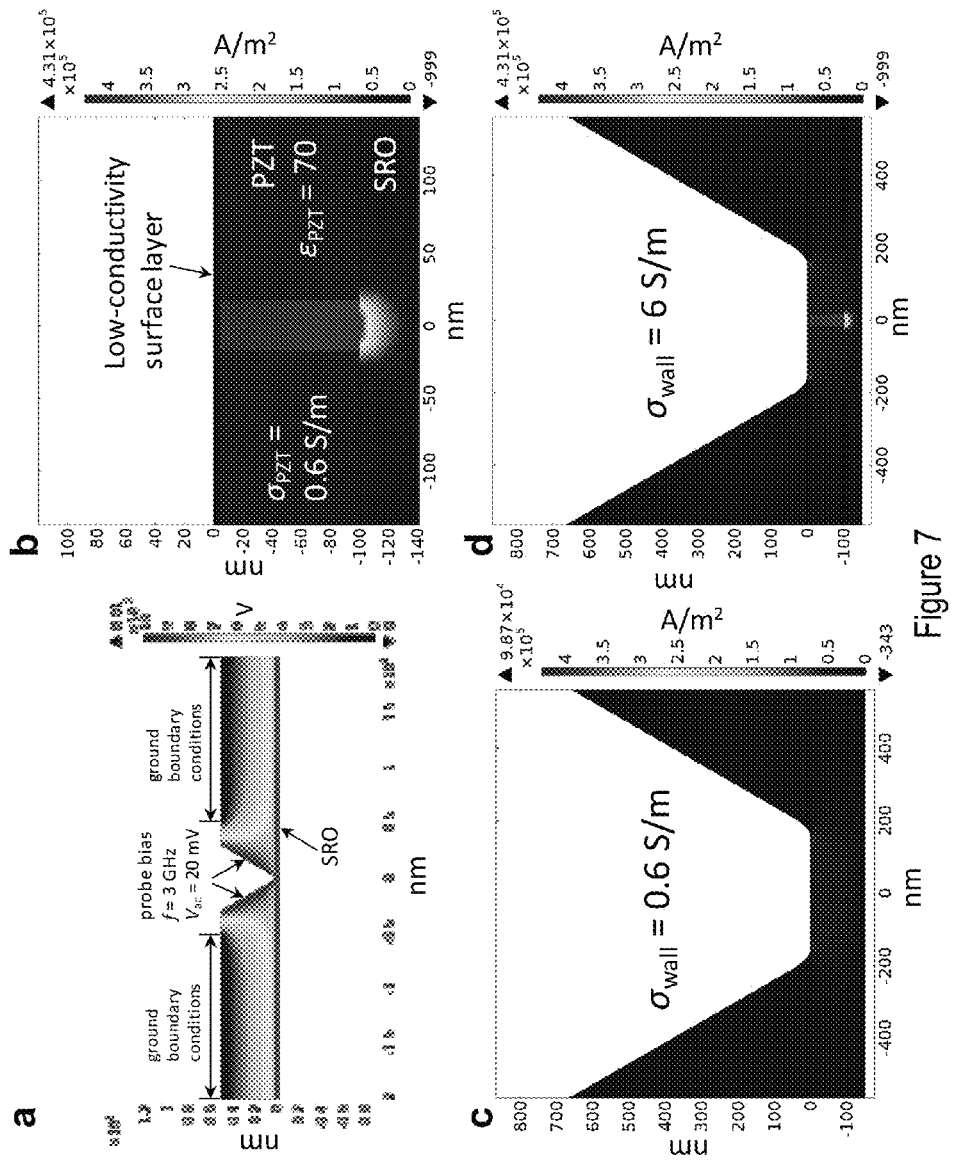
FIG. 7 is a finite elements modeling of microwave AC conductance measurements.

FIG. 7 is a finite elements modeling of microwave AC conductance measurements. To quantify the AC conductivity, calibrated measurements were performed and numerical modeling of the tip-sample admittance alteration in the presence of a conducting domain wall was developed (see FIG. 7 for details). The AC conductivity of the pristine film bulk was estimated to be 0.4-0.7 S/m at 3 GHz. The domain wall AC conductivity fell in a range 4-8 S/m assuming a 3 nm wall thickness, i.e., ca. 10 times higher than in the bulk.

Figure 8:
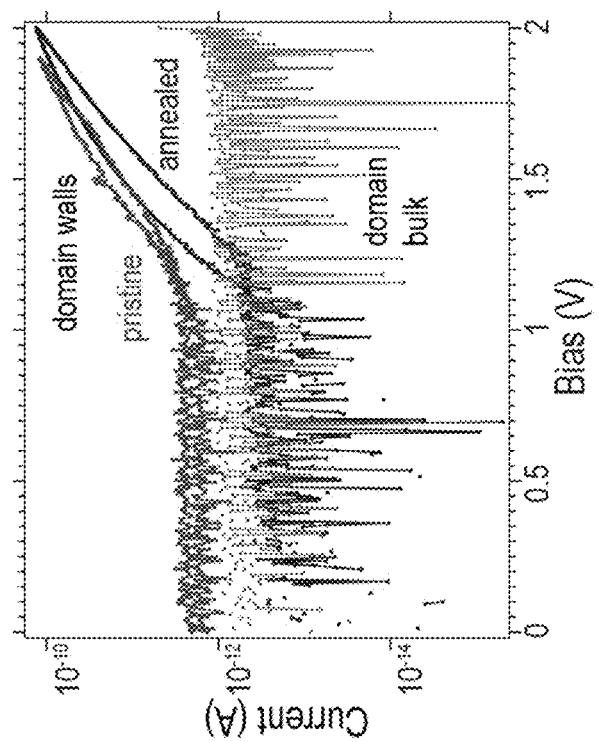
FIG. 8 is a set of curves showing poor DC conductivity of the $Pb(Zr_{0.2}Ti_{0.8})O_3$ film.

With regard to DC conduction of the domain walls, FIG. 8 shows DC conductance of the walls when probed by conductive atomic force microscopy (c-AFM). A rough estimate at a high DC bias (at 10 V) from the DC I-V curves for the domain bulk corresponds to ca. $2\times10^{-3}$ S/m. Therefore, the DC conductivity was 100-200 times smaller than AC conductivity measured at 3 GHz while a similar estimate for the domain wall in the pristine film yields DC conductivity of ca. 0.1 S/m, i. e., about 50 times lower than the AC value.

Generally conductivity at gigahertz frequencies may be larger by orders of magnitude than at DC and show a relatively week, power-law, temperature dependence. A fundamental reason behind this enhancement is that charge carriers localized by energy barriers at DC can contribute to AC conduction by oscillating between the barriers at high frequencies.

With respect to temperature dependence of the domain wall AC conduction, in PZT film, AC conduction exhibited negligible temperature dependence up to 115° C. This is unlike DC conduction of domain walls, which could be both linear and exponential.

With regard to temporal stability, the AC conductance of domain walls was stable over at least 48 hours and showed no degradation. This time is sufficient for the 180° walls to equilibrate aligned along the polar direction of the film. Such domain walls are nominally uncharged, and yet they show clear AC conduction, being minimally perturbed by the AC voltage (down to below 60 mV peak-to-peak at 3 GHz).

To explain the large AC conduction of domain walls, it is noted that domain wall pinning by lattice defects and associated strain and field disorder will disrupt an idealized straight shape of the wall making it locally curved. The curvature in respect to polarization will translate into bound charges distributed along the "roughened" domain wall and compensated by localized clouds of mobile carriers, which are responsible for the enhanced AC conductivity. This effect is reminiscent of AC conduction in metal-insulator composites with metal concentrations below the critical value for percolation threshold. To model this effect, phase-field modeling was implemented in the presence of random-field disorder (see below for details).

Figure 9:
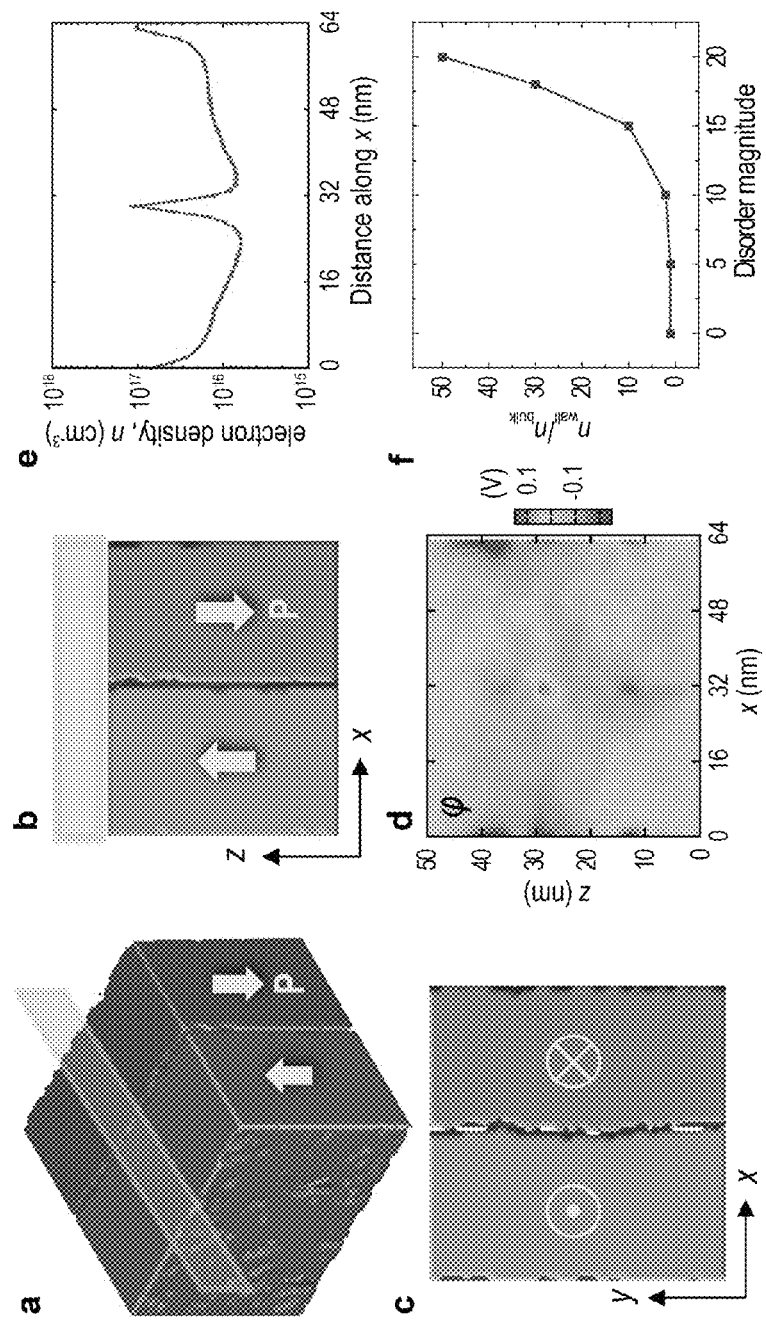
FIG. 9 is a computational evidence that domain wall conductance is tunable by defects in the film.

FIG. 9 is a set of images and curves representing phase-field simulation of a ferroelectric domain structure. Simulations were performed for a $Pb(Zr_{0.2}Ti_{0.8})O_3$ film with a uniform defect disorder. FIG. 9, image (a) represents an equilibrium 3D domain structure with rough 180° domain walls. Parallel domain walls are in the center (visible in the figure) as well as at the sides due to periodic boundary conditions. FIG. 9, images (b) and (c) represent 2D plots of domain structure in the model x-z plane at $y=n_y/2$ (indicated by a green rectangle in image (a)) and on the top surface (x-y plane), respectively. $n_y$ is the model size along the y direction. The effect of the random field on the wall roughness is less obvious in the film interior than in the surface vicinity. FIG. 9, image (d) represents electric potential distribution in the x-z plane at $y=n_y/2$. The electric potential reaches 0.1 V and −0.2 V in the wall region. FIG. 9, image (e) represents electron density averaged along the normal to the film surface (z direction) throughout the film thickness as a function of the position perpendicular to the walls (x direction). The plot shows a higher electron density in the wall vicinity than in the domain bulk. FIG. 9, image (f) represents an averaged ratio of electron density in the wall and bulk regions vs. disorder magnitude. The disorder magnitude was set to M=15 for calculation of the data for the curve in FIG. 9 image (e) and for the map in image (d).

As shown in FIG. 9 images (a-c), the disorder indeed significantly roughens the otherwise smooth domain wall, creating local head-to-head and tail-to-tail polarization configurations along the 180° walls, which is revealed in the modeled electric potential distribution map shown in FIG. 9, image (d). Above a certain disorder strength, substantial electron accumulation is observed along the domain wall (see FIG. 9, images (e) and (f).

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for configuring a microwave-frequency (microwave) alternating current (AC) conductive material, the method comprising:
   in a material comprising a dielectric or semiconducting region, configuring microwave AC conduction paths through the material by manipulating domain wall morphology within the dielectric or semiconducting region to control microwave AC conductivity of the material; and
   the manipulating domain wall morphology within the material includes modifying an incline angle of the domain wall relative to a crystallographic axis of the material by applying an electric field across a dielectric or semiconducting volume of the material, wherein:
   the incline angle of the domain wall is temporarily modified by application of the electric field and the microwave AC conductivity of the domain wall is temporarily gated by the temporarily modified incline angle of the domain wall; or
   the incline angle of the domain wall is modified and held in a stable state by the application of the electric field and the microwave AC conductivity of the material is reconfigured and held in a stable state by the modified incline angle of the domain wall.

2. The method for configuring a microwave AC conductive material of claim 1, the method further comprising:
   increasing or decreasing microwave AC conductivity of the material using the manipulation of the domain wall morphology within the dielectric or semiconducting region.

3. The method for configuring a microwave AC conductive material of claim 1, the method further comprising:
   forming microwave AC pathways through the dielectric or semiconducting region using the manipulation of the domain wall morphology within the dielectric or semiconducting region.

4. The method for configuring a microwave AC conductive material of claim 1, the method further comprising:
   manipulating the domain wall morphology within the dielectric or semiconducting region for controlling the microwave AC conductivity in the material by creating new domain walls, erasing domain walls or reconfiguring domain walls.

5. The method for configuring a microwave AC conductive material of claim 1, the method further comprising:
   modifying the density and placement of the domain walls within the dielectric or semiconducting material to control the microwave AC conductivity of the material.

6. The method for configuring a microwave AC conductive material of claim 1, the method further comprising:
   controlling the microwave AC conductivity of the material and the manipulating domain wall morphology within the dielectric or semiconducting region by applying the electric field at one or more positions on a surface of the material and creating a pattern of domain walls for controlling the microwave AC conductivity of the material to meet microwave AC conductivity criteria.

7. The method for configuring a microwave AC conductive material of claim 1, the method further comprising:
   annealing the material and further manipulating the domain wall morphology to control the microwave AC conductivity of the material.

8. The method for configuring a microwave AC conductive material of claim 1, the method further comprising:
   the manipulating the domain wall morphology within the dielectric or semiconducting region by applying the electric field on a surface of the dielectric or semiconducting region using a cantilever tip or any other electrode, wherein the material is a thin film comprising ferroelectric domains and the dielectric or semiconducting region is a ferroelectric domain.

9. The method for configuring a microwave AC conductive material of claim 1, the method further comprising:
transmitting a microwave AC signal in the material and overcoming contact resistance after manipulating the domain wall morphology within the dielectric or semiconducting region to control the microwave AC conductivity of the material.

10. An article of manufacture, the article of manufacture comprising:
an microwave-frequency (microwave) alternating current (AC) conductive material comprising a dielectric or semiconducting region, the microwave AC conductive material comprising microwave AC conduction paths that are configured by manipulating domain wall morphology within the dielectric or semiconducting region to control the microwave AC conductivity of the microwave AC conductive material;
wherein the domain wall morphology within the material is manipulated by modifying the incline angle of the domain wall relative to a crystallographic axis of the material, by applying an electric field across the material, and wherein:
the incline angle of the domain wall is temporarily modified by application of the electric field and the microwave AC conductivity of the domain wall is temporarily gated by the temporarily modified incline angle of the domain wall; or
the incline angle of the domain wall is modified and held in a stable state by the application of the electric field and the microwave AC conductivity of the material is reconfigured and held in a stable state by the modified incline angle of the domain wall.

11. The article of manufacture of claim 10, wherein transmission of an microwave AC signal in the material after manipulating the domain wall morphology within the dielectric or semiconducting region to control the microwave AC conductivity of the microwave AC conductive material overcomes contact resistance in the material.

12. The article of manufacture of claim 10, wherein the microwave AC conductivity of the microwave AC conductive material is increased or decreased by the manipulation of the domain wall morphology within the dielectric or semiconducting region.

13. The article of manufacture of claim 10, further comprising microwave AC current pathways through the dielectric or semiconducting region that are formed by the manipulation of the domain wall morphology within the dielectric or semiconducting region.

14. The article of manufacture of claim 10, wherein the domain wall morphology within the dielectric or semiconducting region is manipulated for controlling the microwave AC conductivity of the material by creating new domain walls, erasing domain walls or reconfiguring domain walls.

15. The article of manufacture of claim 10, wherein the density and placement of the domain wall within the dielectric or semiconductor is modified to control the microwave AC conductivity of the material.

16. The article of manufacture of claim 10, wherein the microwave AC conductivity of the material and the domain wall morphology within the dielectric or semiconducting region are manipulated by applying the electric field at one or more positions on a surface of the material and creating a pattern of domain walls to meet microwave AC conductivity criteria.

17. The article of manufacture of claim 10, wherein the microwave AC conductive material is a thin film comprising ferroelectric domains, the dielectric or semiconducting region is a ferroelectric domain and the domain wall morphology within the dielectric or semiconducting region is manipulated by applying the electric field on a surface of the dielectric or semiconducting region using a cantilever tip.

18. A system for configuring a microwave-frequency (microwave) alternating current (AC) conductive material, the system comprising:
a material comprising a dielectric or semiconducting region coupled to an electrode;
an electrode that applies an electric field across the material to manipulate domain wall morphology within the dielectric or semiconducting region and configure microwave AC conduction paths through the material to control microwave AC conductivity of the material;
wherein the domain wall morphology within the material is manipulated by modifying an incline angle of the domain wall relative to a crystallographic axis of the material, by applying an electric field across the material, wherein:
the incline angle of the domain wall is temporarily modified by the application of the electric field, and the microwave AC conductivity of the domain wall is temporarily gated by the temporarily modified incline angle of the domain wall; or
the incline angle of the domain wall is modified and held in a stable state by the application of the electric field and the microwave AC conductivity of the material is reconfigured and held in a stable state by the modified incline angle of the domain wall.

19. The system for configuring a microwave AC conductive material of claim 18, wherein the electrode is a cantilever tip, the material is a thin film comprising ferroelectric domains, the dielectric or semiconducting region is a ferroelectric domain and the domain wall morphology within the dielectric or semiconducting region is manipulated by applying the electric field on a surface of the thin film using the cantilever tip.

20. The system for configuring a microwave AC conductive material of claim 18, wherein the electric field applied across the material in a specified pattern and manipulates the domain wall morphology to form microwave AC current pathways through the dielectric or semiconducting region.

21. The system for configuring a microwave AC conductive material of claim 18, wherein the electric field applied across the material manipulates the domain wall morphology for controlling the microwave AC conductivity of the material by creating new domain walls, erasing domain walls or reconfiguring domain walls within the dielectric or semiconducting region.

22. The system for configuring a microwave AC conductive material of claim 18, wherein a density and placement of the domain wall within the dielectric or semiconductor by the electrode is modified to control the microwave AC conductivity of the material.

23. The system for configuring a microwave AC conductive material of claim 18, wherein the electric field across the material manipulates the domain wall morphology to increase or decrease the microwave AC conductivity of the material.

24. A system for configuring a microwave-frequency alternating current conductive material, the system comprising:
- a material comprising a dielectric or semiconducting region coupled to an electrode;
- an electrode that applies an electric field across the material to manipulate a domain wall morphology within the dielectric or semiconducting region and configure microwave alternating current conduction paths to control microwave alternating current conductivity of the material;
  - wherein the domain wall morphology is manipulated by a controlled modification of an incline angle of the domain wall that temporarily gates microwave alternating current conductivity of the domain wall by holding the inclination of the domain wall in a stable state by the application of the electric field.

* * * * *